(12) United States Patent
Sander et al.

(10) Patent No.: US 9,709,639 B2
(45) Date of Patent: Jul. 18, 2017

(54) HALL EFFECT SENSOR

(71) Applicants: Micronas GmbH, Freiburg (DE);
Albert-Ludwigs-Universitaet Freiburg, Freiburg (DE)

(72) Inventors: Christian Sander, Freiburg (DE);
Oliver Paul, Au (DE)

(73) Assignees: TDK-Micronas GmbH, Freiburg (DE);
Albert-Ludwigs-Universitaet Freiburg, Freiburg (DE)

( * ) Notice: Subject to any disclaimer, the term of this patent is extended or adjusted under 35 U.S.C. 154(b) by 125 days.

(21) Appl. No.: 14/798,887

(22) Filed: Jul. 14, 2015

(65) Prior Publication Data
US 2016/0011281 A1    Jan. 14, 2016

(30) Foreign Application Priority Data

Jul. 14, 2014   (DE) .................. 10 2014 010 547

(51) Int. Cl.
| | | |
|---|---|---|
| G01B 7/14 | (2006.01) | |
| G01R 33/07 | (2006.01) | |
| H01L 43/06 | (2006.01) | |

(52) U.S. Cl.
CPC .......... *G01R 33/077* (2013.01); *H01L 43/065* (2013.01)

(58) Field of Classification Search
CPC ........................................ G01R 33/07–33/077
USPC ............................................. 324/251, 207.2
See application file for complete search history.

(56) References Cited

U.S. PATENT DOCUMENTS

| | | |
|---|---|---|
| 6,542,068 B1 | 4/2003 | Drapp et al. |
| 7,511,484 B2 | 3/2009 | Oohira et al. |
| 8,203,329 B2 | 6/2012 | Hohe et al. |
| 8,324,891 B2 | 12/2012 | Kejik et al. |
| 9,007,060 B2 | 4/2015 | Ausserlechner |

(Continued)

FOREIGN PATENT DOCUMENTS

| | | |
|---|---|---|
| CA | 2 384 583 A1 | 3/2001 |
| DE | 199 43 128 A1 | 4/2001 |

(Continued)

OTHER PUBLICATIONS

Ralph Steiner Vanha, "Rotary Switch and Current Monitor by Hall-Based Microsystems," Thesis to Swiss Federal Inst. of Tech., Zurich, pp. 39-53 (1999).

*Primary Examiner* — Patrick Assouad
*Assistant Examiner* — Demetrius Pretlow
(74) *Attorney, Agent, or Firm* — Muncy, Geissler, Olds & Lowe, P.C.

(57) ABSTRACT

A Hall effect sensor with multiple Hall effect elements, each of the Hall effect elements having a first contact terminal, a second contact terminal, and a third contact terminal arranged along a straight line. The multiple Hall effect elements are electrically connected in series in a closed circuit. The second contact terminals of the Hall effect elements are supply voltage connections or Hall voltage pickoffs, and the applicable second contact terminal of the Hall effect element is a center contact of the Hall effect element. The Hall effect elements form two pairs, and the Hall effect elements of one pair each measure the same component of a magnetic field and an operating current is impressed on the series circuit in the two Hall effect elements of this one pair, and a supply voltage is applied to the Hall effect elements of the other pair.

21 Claims, 4 Drawing Sheets

(56) References Cited

U.S. PATENT DOCUMENTS

| | | | |
|---|---|---|---|
| 9,024,622 B2 | 5/2015 | Hohe et al. | |
| 2007/0029999 A1 | 2/2007 | Middelhoek et al. | |
| 2011/0101975 A1* | 5/2011 | Popovic | G01R 15/18 |
| | | | 324/251 |
| 2012/0286776 A1 | 11/2012 | Ausserlechner et al. | |
| 2013/0015853 A1 | 1/2013 | Raz et al. | |
| 2013/0342194 A1* | 12/2013 | Motz | G01R 33/07 |
| | | | 324/251 |
| 2014/0327435 A1 | 11/2014 | Röhrer | |
| 2015/0323614 A1* | 11/2015 | Ausserlechner | H01L 43/065 |
| | | | 324/251 |
| 2015/0346289 A1* | 12/2015 | Ausserlechner | G01R 33/07 |
| | | | 324/251 |

FOREIGN PATENT DOCUMENTS

| | | |
|---|---|---|
| DE | 101 50 955 C1 | 6/2003 |
| DE | 10 2006 051 883 A1 | 8/2007 |
| DE | 10 2006 037 226 | 2/2008 |
| DE | 10 2007 041 230 B3 | 4/2009 |
| DE | 10 2011 107 767 A1 | 1/2013 |
| DE | 10 2011 115 566 A1 | 4/2013 |
| DE | 10 2012 212 594 A1 | 11/2013 |
| DE | 20 2014 004 425 U1 | 10/2014 |
| EP | 0 954 085 A1 | 11/1999 |
| EP | 2 000 813 A1 | 12/2008 |
| JP | 2005-259803 A | 9/2005 |
| WO | WO 2006/028426 A1 | 3/2006 |
| WO | WO 2012/171688 A1 | 12/2012 |

\* cited by examiner

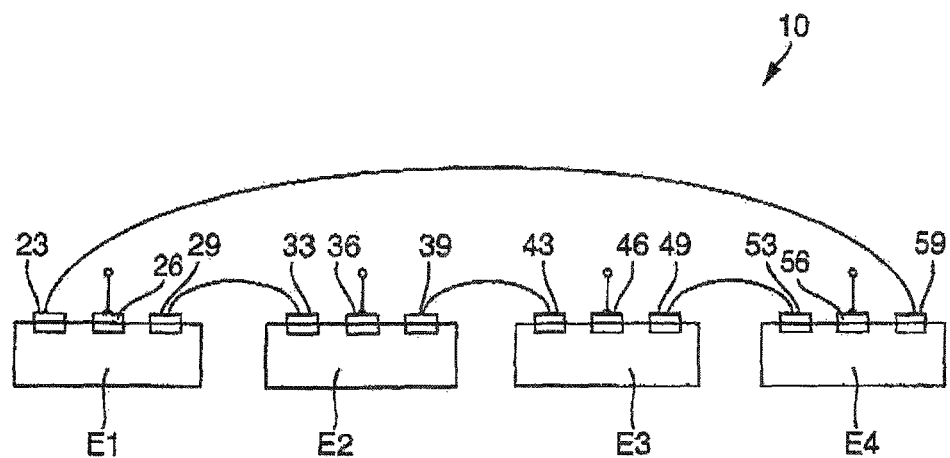
Prior art  Fig. 5
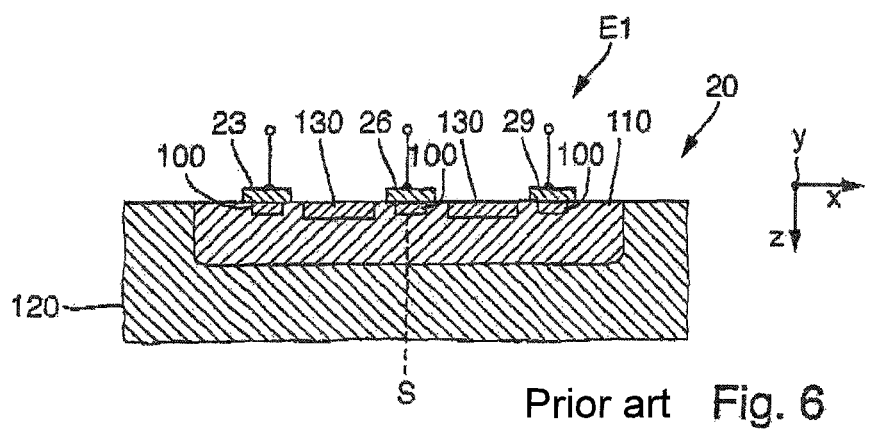
Prior art  Fig. 6

HALL EFFECT SENSOR

This nonprovisional application claims priority under 35 U.S.C. §119(a) to German Patent Application No. 10 2014 010 547.4, which was filed in Germany on Jul. 14, 2014, and which is herein incorporated by reference.

BACKGROUND OF THE INVENTION

Field of the Invention

The present invention relates to a Hall effect sensor.

Description of the Background Art

Vertical Hall effect sensors are known from EP 9 540 85 A1, which corresponds to U.S. Pat. No. 6,542,068, and DE 101 50 955 C1, in which multiple electrically conductive regions extend into a substrate to form multiple Hall effect elements perpendicular to the surface of the substrate, and multiple contact regions have a side surface at the surface of the substrate. In addition, arrangements of Hall effect sensors are known from EP 2 000 813 A1, which corresponds to U.S. Pat. No. 8,324,891, and US 2011/0101975 A1 for the purpose of determining the components of a magnetic field in a plane or the magnitude and direction in the plane.

Hall effect sensors are used in many technical fields, in particular to sense the position of switches or actuators in a contactless and wear-free manner. Many advantages are offered by the use and spatial sensing of magnetic fields as compared to optical or mechanical sensing, since the technologies based on magnetic fields are, in particular, considerably less sensitive to contamination.

A Hall effect sensor device is known from DE 10 2011 107 767 A1 that has four Hall effect elements connected in series, which are especially suitable for reducing the effects of offset voltages via the spinning current method. The spinning current method is known in connection with lateral Hall effect sensors for suppressing the offset of the sensor signal from the book "Rotary Switch and Current Monitor by Hall-Based Microsystems" by Ralph Steiner Vanha, published by Physical Electronics Laboratory, Swiss Federal Institute of Technology (ETH), Zurich, 1999, pages 39-53. The spinning current method consists of cyclically rotating the measurement and current direction at the Hall effect sensor by 90°, for example, on a continuous basis at a specific clock frequency and summing over all measurement signals of a full rotation through 360°, thereby reducing the effect of offset voltages.

SUMMARY OF THE INVENTION

It is therefore an object of the present invention to provide a device that advances the conventional art.

According to an exemplary embodiment of the invention, a Hall effect sensor with multiple Hall effect elements is provided, wherein each of the Hall effect elements can have a first contact terminal and a second contact terminal and a third contact terminal and can be arranged along a straight line, and wherein the multiple Hall effect elements can be electrically connected in series in the form of a closed circuit in that the first contact terminals and the third contact terminals of the individual Hall effect elements can be connected to one another, and wherein the second contact terminals of the Hall effect elements can be implemented as supply voltage connections or as Hall voltage pickoffs, and the applicable second contact terminal of the Hall effect element can be implemented as a center contact of the Hall effect element, and wherein the Hall effect elements form two pairs or can be arranged in two pairs, and the Hall effect elements of one pair each measure the same component of a magnetic field and an operating current can be impressed on the series circuit in the two Hall effect elements of this one pair, and a supply voltage can be applied to the Hall effect elements of the other pair, wherein the angle between the straight lines within a pair can be less than 20 degrees, and the angle between straight lines of the two pairs can lie in a range between 70 degrees and 110 degrees. The two center contacts of the Hall effect elements can each be connected to one input of a differential amplifier for measuring the Hall voltage.

The Hall effect elements arranged parallel to one another can each be sensitive to the same component of the magnetic field, and at least one Hall effect element can be arranged along each individual side of the quadrilateral. The Hall voltage can be determined as the voltage difference of the center contacts of opposite Hall effect elements, wherein the Hall voltages at the center contacts have opposite polarity in the case of an opposite direction of the current through the two Hall effect elements. In other words, the Hall voltage determined can be twice as large as in comparison to the Hall voltage of a single Hall element.

If the direction of the current is the same for opposite Hall elements, the Hall voltage of the elements cancels itself out in the formation of the voltage difference of the center contacts.

An advantage is that two magnetic field components lying in a plane can be measured by the an arrangement of at least four Hall effect elements. Because the arrangement requires little space, the magnetic field can be determined cost-effectively with high spatial resolution. Furthermore, the Hall effect elements located in immediate spatial proximity to one another are subject to comparable external conditions, in particular magnetic field conditions.

Each of the Hall effect elements can be located along a side of a quadrilateral or along an arm of a cross. In addition, it is advantageous to connect exactly four Hall effect elements in series, which is to say to arrange exactly one Hall effect element along each side or along each arm. The quadrilateral can be implemented as a rectangular quadrilateral, in particular as a square.

In an embodiment, semiconductor switches can be provided in electrical connecting lines between the Hall effect elements in order to change a direction of the current in the Hall effect elements. At least one semiconductor switch can be connected in each of the electrical connecting lines implemented between two adjacent Hall effect elements.

In an embodiment, the direction of the current of two Hall effect elements located opposite one another can be opposite in a first circuit configuration in order to measure a first component of a magnetic field in the first configuration. Furthermore, a second circuit configuration can be provided in which the direction of the current in the two Hall effect elements is the same, but wherein the other two Hall effect elements, which are likewise located opposite one another, have a mutually opposite current direction in the second current configuration in order to measure a second component of a magnetic field. In other words, a first magnetic field component and then a second magnetic field component perpendicular to the first can be determined sequentially via the at least four Hall effect elements. The switching can be carried out via the connected semiconductor switches.

The Hall effect elements can be implemented as vertical Hall plates. In this case, the Hall effect elements can be integrated into a semiconductor body, wherein the term vertical can be defined by the formation of the plates substantially perpendicular to the surface of the semiconductor body. The Hall effect elements can all have the same structure. Furthermore, an integrated circuit can be provided wherein the circuit arrangement and the Hall effect elements can be monolithically integrated into a common semiconductor body. The circuit arrangement can stand in operative electrical connection with the Hall effect elements and the semiconductor switches. The circuit arrangement can be configured to switch between the first circuit configuration and the second circuit configuration and can determine the Hall voltage at the center contact terminals. To this end, the center contact terminals can be connected to the inputs of a differential amplifier.

In an embodiment, the Hall effect elements can be arranged substantially symmetrically along the four sides about a common centroid, wherein two Hall effect elements located opposite one another have the same spacing from the centroid.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 5 shows a Hall effect sensor with a series circuit of four Hall effect elements, and FIG. 6 shows a cross-section of a Hall effect element according to FIG. 4.

DETAILED DESCRIPTION

Figure 1:
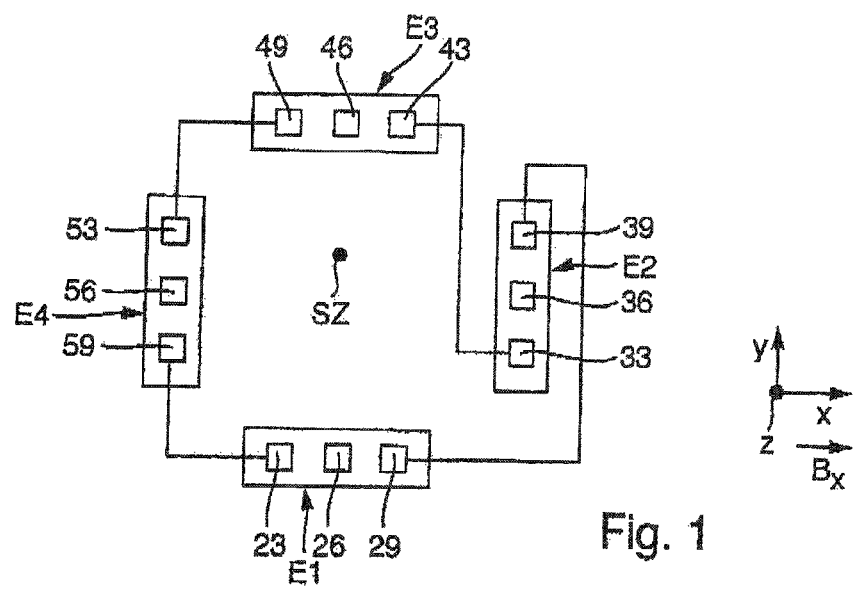
FIG. 1 shows an exemplary embodiment according to the invention of a Hall effect sensor composed of a series circuit of four Hall effect elements in a first circuit configuration that is sensitive exclusively to magnetic fields in the X direction.

FIG. 1 shows a first embodiment according to the invention of the Hall effect sensor 10 with four Hall effect elements E1 to E4, wherein the Hall effect elements E1 to E4 are electrically connected in series according to a first circuit configuration. The four Hall effect elements E1 to E4 are arranged along four sides, not shown, of a square, which is to say that exactly one Hall effect element E1 to E4 is arranged along each side of the square. Furthermore, the four Hall effect elements E1 to E4 are arranged symmetrically about a common centroid SZ, with each of the Hall effect elements E1 to E4 having the same spacing from the centroid SZ.

The Hall effect elements E1, E2, E3, and E4 are implemented as vertical Hall effect elements, in particular as Hall plates, wherein pairs of Hall effect elements located opposite one another have the same structure. A preferred structure of the Hall effect elements E1 to E4 in accordance with the prior art is shown in detail in FIGS. 4 and 5. In contrast to FIGS. 4 and 5, the embodiment shown in FIG. 1 in the present case shows a top view of the Hall effect elements implemented within a semiconductor surface. Here, the direction of a magnetic field B to be measured extends in an X direction, which is to say that the direction of a magnetic field to be measured lies in the plane of the drawing, or parallel to the semiconductor surface.

Each of the Hall effect elements E1, E2, E3, and E4 has a first contact terminal 23, 33, 43, and 53, and a second contact terminal 26, 36, 46, and 56, and a third contact terminal 29, 39, 49, and 59. The series circuit results from the fact that the first contact terminals 23, 33, 43, and 53 and the third contact terminals 29, 39, 49, and 59 are connected as outer contact terminals. This produces a closed ring formed of the Hall effect elements E1, E2, E3, and E4 electrically connected in series.

In the present case, the Hall effect element E2 is connected such that the direction of the current is opposite to that of the Hall effect element E4 located opposite thereto. In this way, the second contact terminals 36 and 56 or 26 and 46 are implemented as Hall voltage pickoffs, and provide a Hall voltage with opposite polarity if a magnetic field component in the X direction is present. Accordingly, the second contact terminals 26 and 46 or 36 and 56 are connected to a supply voltage that is not shown.

In FIG. 5, an embodiment corresponding to the prior art is shown, having a series circuit of a total of four Hall effect elements E1 to E4. Each of the Hall effect elements E1 to E4 has exactly three contact terminals 23, 26, and 29, or 33, 36, and 39, or 43, 46, and 49, or 53, 56, and 59. The two outer contact terminals 23, 29, and 33, 39, and 43, 49, and 53 and 59 of each Hall effect element E1, E2, E3, and E4 are each connected to the outer contact terminals 23, 29, and 33, 39, and 43, 49, and 53 and 59 of the two immediately adjacent Hall effect elements. Two of the center contact terminals 26, 36, 46, and 56 are implemented as supply voltage connections, and the other two center contact terminals 26, 36, 46, and 56 are implemented as Hall voltage pickoffs. The Hall effect elements E1 to E4 connected in series each have a symmetrical structure of the contact terminals 23-59, which is to say the two outer contact terminals 23, 29, and 33, 39, and 43, 49, and 53 and 59 of each Hall effect element have the same spacing with respect to the applicable center contact terminal 26, 36, 46, and 56 of the Hall effect element E1 to E4.

FIG. 6 shows a cross-section of an individual Hall effect element E1 to E4 of the Hall effect elements E1 to E4 according to the prior art shown in FIG. 5. In structure, the Hall effect elements E1 to E4 correspond to the Hall effect elements E1 to E4 from FIG. 1. The individual Hall effect element E1 to E4 here is designed to be symmetrical with respect to a plane of symmetry S that extends in the longitudinal direction centrally through the second contact terminal 26, and thus through the Hall effect element E1 to E4. The geometrical dimensions and the technological implementation in a CMOS process of all Hall effect elements E1 to E4 of a Hall effect sensor are chosen to be identical or preferably largely identical.

Figure 2:
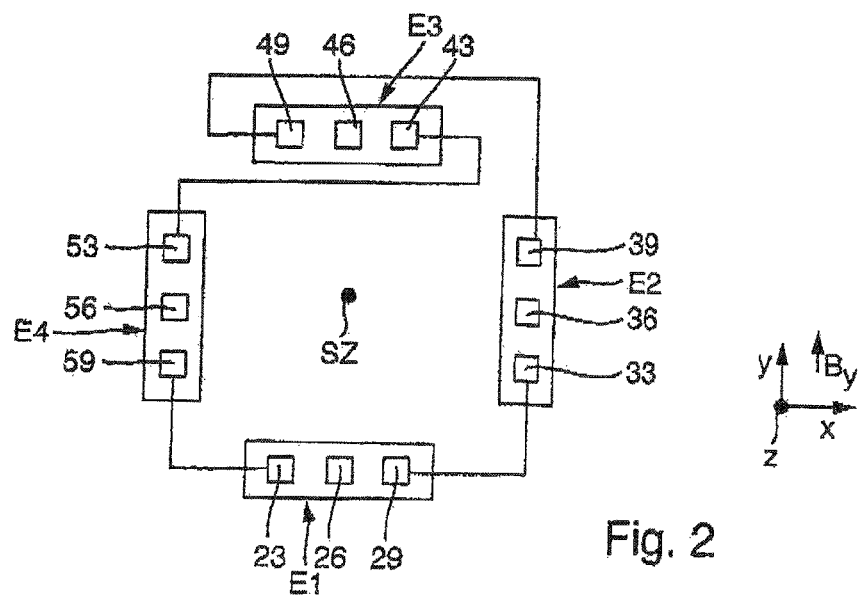
FIG. 2 shows a configuration of the embodiment shown in FIG. 1 that is sensitive exclusively to magnetic fields in the Y direction.

FIG. 2 shows a second circuit configuration of the embodiment shown in FIG. 1. In the following, only the differences are explained. While only the X component Bx of a magnetic field can be determined in the first circuit configuration, the Y component By of the magnetic field can be determined with the present second circuit configuration.

To this end, the Hall effect element E3 is connected such that the direction of the current is opposite to the Hall effect element E1 located opposite thereto. In this way, the second contact terminals 26 and 46 are implemented as Hall voltage pickoffs, and provide a Hall voltage with opposite polarity if a magnetic field component By in the Y direction is present. Accordingly, the second contact terminals 36 and 56 are connected to a supply voltage that is not shown.

Figure 3:
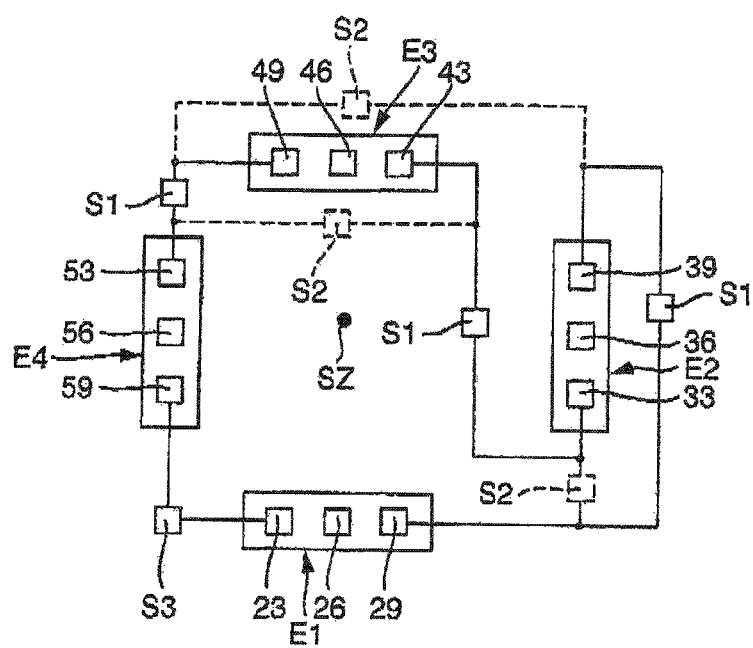
FIG. 3 shows a Hall effect sensor with connected semiconductor switches.
Figure 3:
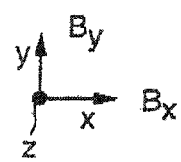

FIG. 3 shows a second embodiment according to the invention of a Hall effect sensor with semiconductor switches S1, S2, and S3 connected between the individual Hall effect elements E1 to E4. The semiconductor switches S1 and S2 are each connected by an electric line that is not shown to a control unit that likewise is not shown. By means of the control unit, it is possible to switch between the first circuit configuration and the second circuit configuration by opening or closing the semiconductor switches S2. The switch S3 is only connected for reasons of symmetry, and is closed in both circuit configurations. With the advantageous switching between the two circuit configurations, both the X component Bx and the Y component By of the magnetic field can be determined with the four Hall effect elements. In the present case, the first circuit configuration is present, which is to say that all three switches S1 are closed and all three switches S2 are open and the current flows along the solid lines.

In the second circuit configuration, all three switches S1 are open and all three switches S2 are closed, which is to say the current only flows along the dashed lines in the Hall effect elements E2 and E3. By this means, the current direction in the second circuit configuration is reversed in the Hall effect elements E2 or E3 in the case in which the Hall effect elements E2 and E3 are used as Hall voltage pickoffs.

Figure 4:
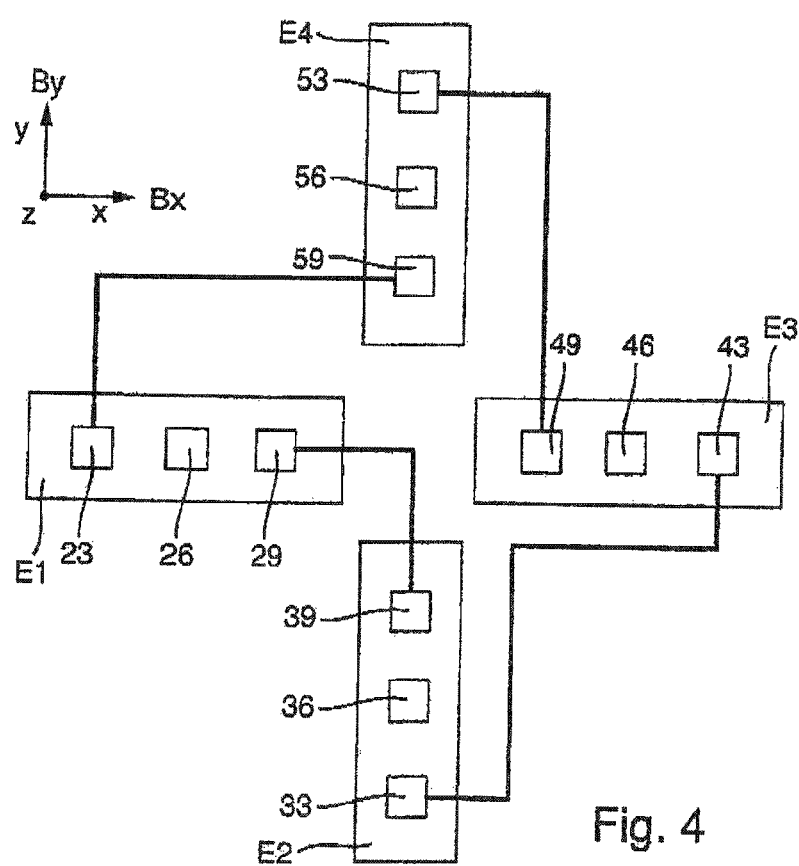
FIG. 4 shows a Hall effect sensor.

FIG. 4 shows another embodiment. In the following, only the differences from one of the preceding circuit configurations are explained. The Hall effect elements E1 to E4 are now arranged as a cross, which is to say each Hall effect element is located along an arm of the cross. With the present electrical interconnection, the magnetic field sensor is configured for measuring a magnetic field component in the X direction. In an interconnection configuration that is not shown, a By component of the magnetic field can be measured with the arrangement of the magnetic field sensor shown instead of the Bx component of the magnetic field.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A Hall effect sensor with a plurality of Hall effect elements, each of the Hall effect elements comprising:
   a first contact terminal;
   a second contact terminal; and
   a third contact terminal, the first, second and third contact terminals of each Hall effect element being arranged linearly,
   wherein the plurality of Hall effect elements are electrically connected in series in a closed circuit such that at least three Hall effect elements of the plurality of Hall effect elements have the first contact terminal connected to the third contact terminal of another of the at least three Hall effect elements, such that current flows in a single circular direction through the at least three Hall effect sensors,
   wherein the second contact terminals of the Hall effect elements are supply voltage connections or Hall voltage pickoffs,
   wherein the second contact terminal of each Hall effect element is a center contact of the Hall effect element,
   wherein the Hall effect elements form two pairs, and the Hall effect elements of a first pair of the two pairs each measure a same component of a magnetic field,
   wherein an operating current is impressed on the series circuit in the two Hall effect elements of the first pair, and
   wherein a supply voltage is applied to the Hall effect elements of a second pair of the two pairs,
   wherein the two second contact terminals of the first pair face each other along a first axis and the two second contact terminals of the second pair face each other along a second axis,
   wherein the first pair of Hall effect elements are arranged along two first substantially parallel lines, and
   wherein the second pair of Hall effect elements are arranged along two second substantially parallel lines, the two first parallel lines and the two second parallel lines being substantially perpendicular.

2. The Hall effect sensor according to claim 1, wherein each of the Hall effect elements is arranged along a side of a quadrilateral.

3. The Hall effect sensor according to claim 2, wherein the quadrilateral is a rectangular quadrilateral.

4. The Hall effect sensor according to claim 2, wherein the quadrilateral is a square.

5. The Hall effect sensor according to claim 1, wherein semiconductor switches are provided in electrical connecting lines between the Hall effect elements in order to change a direction of the current in at least one of the Hall effect elements.

6. The Hall effect sensor according to claim 1, wherein at least one semiconductor switch is connected in series in each of the electrical connecting lines implemented between two adjacent Hall effect elements of the plurality of Hall effect elements.

7. The Hall effect sensor according to claim 1, wherein direction of current of two Hall effect elements located opposite one another is opposite in a first circuit configuration in order to measure a first component of a magnetic field in the first configuration, and wherein, in a second circuit configuration, the direction of the current in the two Hall effect elements is the same.

8. The Hall effect sensor according to claim 1, wherein, in a second current configuration, the other two Hall effect elements located opposite one another have a mutually opposite current direction in order to measure a second component of a magnetic field.

9. The Hall effect sensor according to claim 1, wherein the Hall effect elements are implemented as vertical Hall plates.

10. The Hall effect sensor according to claim 1, wherein the Hall effect elements of at least one of the two pairs have the same structure.

11. The Hall effect sensor according to claim 1, wherein the Hall effect elements are arranged along four sides symmetrically about a common centroid, and wherein each of the Hall effect elements located opposite one another have a same spacing from the common centroid.

12. The Hall effect sensor according to claim 1, wherein an integrated circuit is provided, and wherein the circuit arrangement and the Hall effect elements are monolithically integrated into a common semiconductor body.

13. The Hall effect sensor according to claim 1, wherein each second contact terminal of the Hall effect elements of the first pair are Hall voltage pickoffs, and
wherein each second contact terminal of the Hall effect elements of the second pair are supply voltage connections.

14. The Hall effect sensor according to claim 1, wherein the first, second, and third contact terminals of each Hall effect element of the first pair of Hall effect elements are aligned in a plane along a first straight line,
wherein the first, second, and third contact terminals of each Hall effect element of the second pair of Hall effect elements are aligned in the plane along a second straight line, and
wherein the first straight line and the second straight line form a cross in the plane.

15. The Hall effect sensor according to claim 1, wherein all the terminals of each of the Hall effect elements are positioned on sides of a square in a plane.

16. The Hall effect sensor according to claim 14, wherein the second contact terminal of each of the Hall effect elements is equidistant from the center of the square.

17. The Hall effect sensor according to claim 1, wherein at least three Hall effect elements of the plurality of Hall effect elements have the operating current flowing through in a first direction, and wherein only one Hall effect element of the plurality of Hall effect elements has the operating current flowing through in a second direction, opposite the first direction.

18. The Hall effect sensor according to claim 1, further comprising:
a first set of switches; and
a second set of switches,
wherein the first set of switches being ON and the second set of switches being OFF defines a first sensing configuration,
wherein the first set of switches being OFF and the second set of switches being ON defines a second sensing configuration, and
wherein the first sensing configuration senses a first component of a magnetic field and the second sensing configuration senses a second component of the magnetic field.

19. A Hall effect sensor with a plurality of Hall effect elements, each of the Hall effect elements comprising:
a first contact terminal;
a second contact terminal; and
a third contact terminal, the first, second and third contact terminals of each Hall effect element being arranged in a line,
wherein the plurality of Hall effect elements are electrically connected in series in a closed circuit such that the first contact terminals and the third contact terminals of individual Hall effect elements are connected to one another,
wherein the second contact terminals of the Hall effect elements are supply voltage connections or Hall voltage pickoffs,
wherein the second contact terminal of each Hall effect element is a center contact of the Hall effect element,
wherein the Hall effect elements form two pairs, a first pair of the two pairs measuring a first component of a magnetic field, a second pair of the two pairs measuring a second component of the magnetic field,
the Hall effect sensor further comprising:
a first set of switches; and
a second set of switches,
wherein the first set of switches being ON and the second set of switches being OFF defines a first sensing configuration,
wherein the first set of switches being OFF and the second set of switches being ON defines a second sensing configuration, and
wherein the first sensing configuration senses the first component of the magnetic field and the second sensing configuration senses the second component of the magnetic field.

20. The Hall effect sensor according to claim 1, wherein a first angle between the two first substantially parallel lines less than 20 degrees, and a second angle between each of the two first substantially parallel lines and the two second substantially parallel lines is in a range between 70 degrees and 110 degrees.

21. A Hall effect sensor, comprising:
a first hall effect element, a second hall effect element, a third hall effect element, and a fourth hall effect element in a closed circuit, the second hall effect element and the fourth hall effect element forming a first pair, the first hall effect element and the third hall effect element forming a second pair, and the first hall effect element, the second hall effect element, the third hall effect element, and the fourth hall effect element being disposed on a semiconductor body in a plane;
the first, second, third and fourth hall effect element each comprising:
a first contact terminal, a second contact terminal, and a third contact terminal arranged in a line, the second contact terminal disposed between the first contact terminal and the third contact terminal,
wherein the two second contact terminals of the first pair are disposed along a horizontal axis and the two second contact terminals of the second pair are disposed along a vertical axis,
wherein the second and fourth Hall effect elements of the first pair each measure a same component of a magnetic field,
wherein an operating current is impressed on the closed circuit at the second contact terminals of the second and fourth Hall effect elements of the first pair, and
wherein a supply voltage is applied to the second contact terminals of the first and third Hall effect elements of the second pair,
wherein current in the closed circuit flows in a first direction through the fourth hall effect element and in a second direction through the second hall effect element, the first direction and the second direction being opposite to each other and being parallel to the vertical axis, and
wherein the current in the closed circuit flows in a third direction through the first hall effect element and in a fourth direction through the third hall effect element, the third direction and the fourth direction being parallel to each other and parallel to the horizontal axis.

* * * * *